(12) United States Patent
Drew et al.

(10) Patent No.: US 9,320,168 B2
(45) Date of Patent: Apr. 19, 2016

(54) CONTROL APPARATUS, IN PARTICULAR FOR A MOTOR VEHICLE

(71) Applicant: CONTINENTAL AUTOMOTIVE GMBH, Hannover (DE)

(72) Inventors: Gregory Drew, Zeitlarn (DE); Thomas Riepl, Bad Abbach (DE)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 14/400,030

(22) PCT Filed: May 7, 2013

(86) PCT No.: PCT/EP2013/059483
§ 371 (c)(1),
(2) Date: Nov. 10, 2014

(87) PCT Pub. No.: WO2013/167588
PCT Pub. Date: Nov. 14, 2013

(65) Prior Publication Data
US 2015/0098198 A1 Apr. 9, 2015

(30) Foreign Application Priority Data
May 8, 2012 (DE) .......................... 10 2012 207 599

(51) Int. Cl.
*H05K 5/00* (2006.01)
*H05K 7/14* (2006.01)
*H05K 1/14* (2006.01)
*H05K 3/46* (2006.01)

(52) U.S. Cl.
CPC .............. *H05K 7/1427* (2013.01); *H05K 5/006* (2013.01); *H05K 5/0069* (2013.01); *H05K 1/144* (2013.01); *H05K 1/147* (2013.01); *H05K 3/4691* (2013.01); *H05K 2201/10189* (2013.01); *H05K 2201/10409* (2013.01); *H05K 2201/10598* (2013.01)

(58) Field of Classification Search
USPC .................................. 361/752, 818, 756, 748
See application file for complete search history.

(56) References Cited

U.S. PATENT DOCUMENTS 5,134,546 A 7/1992 Izumi et al.
5,709,557 A 1/1998 Martin et al.
(Continued)

FOREIGN PATENT DOCUMENTS

DE 3345701 A1 6/1985
DE 3942392 A1 6/1990
(Continued)

*Primary Examiner* — Andargie M Aychillhum
(74) *Attorney, Agent, or Firm* — Laurence A. Greenberg; Werner H. Stemer; Ralph E. Locher

(57) ABSTRACT

A control apparatus has a housing and a first integral, multi-layer printed circuit board with first, second and third parts. The first part carries electric and/or electronic components, the second part is electrically and mechanically connected to a contact pin of a first plug-in connector, and the third part connects the first and the second parts. A second integral, multilayer printed circuit board has first, second and third parts. The first part is equipped with electric and/or electronic components, the second part is electrically and mechanically connected to a contact pin of a second plug-in connector, and the third part connects the first and second parts. The two printed circuit boards in their third part are flexible or at least bendable. A connection element interconnects the first parts of the printed circuit boards.

7 Claims, 2 Drawing Sheets

(56) References Cited

U.S. PATENT DOCUMENTS

| | | |
|---|---|---|
| 6,028,770 A | 2/2000 | Kerner et al. |
| 8,087,165 B2 * | 1/2012 | Snider .................. H04B 1/082 174/5 R |
| 8,305,773 B2 * | 11/2012 | Snider .................. B21D 26/027 361/818 |

FOREIGN PATENT DOCUMENTS

| | | |
|---|---|---|
| DE | 29614725 U1 | 10/1996 |
| DE | 102006025977 A1 | 12/2007 |
| DE | 102010034975 A1 | 2/2012 |
| EP | 0501192 A1 | 9/1992 |
| EP | 1575344 A1 | 9/2005 |

* cited by examiner

CONTROL APPARATUS, IN PARTICULAR FOR A MOTOR VEHICLE

BACKGROUND OF THE INVENTION

Field of the Invention

The invention relates to a control apparatus, in particular a control apparatus for a motor vehicle, comprising a housing, in which a multilayered printed circuit board is accommodated.

This patent application claims the priority of the German patent application No. 10 2012 207 599.2, the disclosure content of which is incorporated herein by reference.

Designs of a control apparatus with a parallel male connector outlet are known, but these have a not inconsiderable space requirement owing to their physical shape. In the case of a parallel male connector outlet, the male connector parts are arranged on an end side of a housing of the control apparatus, so that the joining direction of the plug-type connector runs parallel to a base plate of the housing. This design has proven to be advantageous owing to a reduced physical height.

It is known to use plug-type connectors in which the male connector contacts are bent in such a way that they stand vertically on one side on the printed circuit board plane and, owing to the bending of the contact pins, the joining direction of the male connector runs parallel to this printed circuit board plane. With this known design, it has proven to be disadvantageous that the region in which the male connector contacts run between the male connector part and the printed circuit board cannot be populated with electrical or electronic components and therefore this part of the printed circuit board cannot be used. Furthermore, there is the problem that, with an increasing number of male connector contact rows, an ever greater proportion of the printed circuit board can no longer be used for electrical and/or electronic components in the joining direction of the plug-type connector. Since the physical space which a control apparatus should take up is becoming ever smaller, the required components need to be arranged on that part of the printed circuit board which is reduced by the plug-type connector. This results in considerable demands being placed on the printed circuit board and on the layout of the circuit arrangement.

In order to solve this problem, it is known from EP 1 575 344 A1 to provide a multilayered printed circuit board over a multilayered bending region with a likewise multilayered connection region for a plug-type connector in a control apparatus. The contacts of the plug-type connector stand vertically on that part of the printed circuit board which is connected to the plug-type connector. By virtue of this arrangement, the proportion of basic area of the printed circuit board on which electrical and/or electronic components can be arranged is increased. In such a control apparatus, a so-called rigid-flexible printed circuit board is used as printed circuit board, in which the bending region is flexible or bendable.

A rigid-flexible printed circuit board has, at least in the flexible part of the printed circuit board, a flexible core, manufactured from polyimide, for example, as substrate material. This core is provided with in each case one metal cladding on both sides and, in the rigid region, in this case the first and second parts of the printed circuit board, is provided with further layers, consisting of rigid substrate materials (base material), for example glass fibers and epoxy resin (FR4) and likewise a metal cladding.

These layers can be connected in each case by an adhesive layer (prepreg). A printed circuit board with such a design can thus be bent in the flexible part, which consists of layers with a flexible intermediate layer, a polyimide core, in such a way that the contact elements of the plug-type connector run parallel to the printed circuit board plane of a main part of the printed circuit board in the bent state.

BRIEF SUMMARY OF THE INVENTION

The object of the present invention consists in improving a control apparatus of the type mentioned above functionally and/or structurally.

This object is achieved according to the invention by a control apparatus as claimed. Advantageous configurations result from the dependent patent claims.

The control apparatus according to the invention, which is intended in particular for use in a motor vehicle, has a housing. In addition, it has a first, integral multilayered printed circuit board, which has a first part, a second part, and a third part. The first part is populated with electrical and/or electronic components. The second part is electrically and mechanically connected to at least one contact pin of a first plug-type connector. The third part connects the first and second parts of the first printed circuit board, wherein the first printed circuit board is flexible or at least bendable in the third part. Furthermore, the control apparatus has a second, integral multilayered printed circuit board, which likewise has a first part, a second part and a third part. The first part is populated with electrical and/or electronic components. The second part is electrically and mechanically connected to a contact pin of a second plug-type connector. The third part connects the first and second parts of the second printed circuit board, wherein the second printed circuit board is flexible or at least bendable in this third part. At least one connecting element connects the first parts of the first and second printed circuit boards electrically to one another via a plug-type connection.

This design provides the advantage that the control apparatus has two plug-type connectors on different housing surfaces. As a result, a control apparatus which has a size which is unchanged with respect to a conventional control apparatus can have a substantially greater number of plug-type connections towards the outside. As a result of the fact that, in addition, two printed circuit boards are provided in the interior of the housing, which printed circuit boards are connected electrically to one another via the connecting element, substantially greater functionality in comparison with conventional control apparatuses having approximately the same size can be realized.

In a control apparatus according to the invention, therefore, two integral, multilayered printed circuit boards which are electrically connected to one another via the connecting element are accommodated, as are described in EP 1 575 344 A1. A layer of a printed circuit board should in this case be understood to mean a metal cladding applied to a substrate material. The substrate material can be clad on both one and two sides. A layer of the printed circuit board can contain conductor tracks and/or ground and supply surfaces. In the case of a respective one of the multilayered printed circuit boards, main printed circuit boards with the electronic components are connected to a likewise multilayered connection region for a plug-type connector via a multilayered bending region. The contacts of the respective plug-type connector in this case stand vertically on the second part of the associated printed circuit board. By virtue of this arrangement, not only the proportion of the base area of the printed circuit board (i.e. of the first part) on which electrical and/or electronic components can be arranged is increased, but rather, by virtue of the provision of two printed circuit boards, the space available for components is even doubled in an extreme case.

The printed circuit boards are flexible or bendable in their third part of the printed circuit board. Flexible means that the printed circuit board returns approximately to its initial form after bending without being struck. Bendable means that the printed circuit board can bend without being destroyed and, after the bending, remains largely in the form into which it has been bent.

Printed circuit boards which have a single bending region can be manufactured very easily in contrast to those printed circuit boards which have multiple bending regions. Although, in the case of the control apparatus according to the invention, a plurality of individual components need to be handled, this can be managed in practice more easily than providing a single printed circuit board with multiple bending regions. A further advantage consists in that a control apparatus with two integral, multilayered printed circuit boards, owing to the construction kit principle, enables greater flexibility in the provision of different variants of control apparatuses.

In an advantageous configuration, the first parts of the first printed circuit board and the second printed circuit board are mechanically connected to one another by means of the connecting element, the first part of the first printed circuit board is held mechanically on the housing, and the first part of the second printed circuit board is not fastened to the housing. In this way, a particularly simple assembly of the control apparatus can be made possible.

In an expedient configuration, the first parts of the first and second printed circuit boards are arranged parallel to one another in the housing, wherein the first and second plug-type connectors are arranged on different main surfaces of the housing. For example, the two plug-type connectors can be arranged on opposite main surfaces of the housing. This means that the second parts of the first and second printed circuit boards are arranged parallel to one another. In other words, the joining direction of the two plug-type connectors is parallel to the base plates of the housing and along a common axis.

In another configuration, the plug-type connectors can also be arranged on adjoining main surfaces. As a result, the second parts of the first and second printed circuit boards are arranged perpendicular to one another. In this case, too, the joining direction of the two plug-type connectors is parallel to the base plates of the housing, wherein the axes of the joining direction of the two plug-type connectors are perpendicular to one another, however.

The main surfaces of the housing of the control apparatus on which the plug-type connectors are formed are calculated substantially according to an installation situation of the control apparatus.

Expediently, the first and second printed circuit boards are arranged on opposite sides of the housing. This enables a compact housing since the two printed circuit boards can each be positioned in the housing with the configuration of an "L" and are arranged in double-mirrored fashion with respect to one another. As a result, a housing with a minimum height can be provided.

In a further expedient configuration, contact pins of the connecting element are electrically connected to one another by way of conductor tracks of the first parts of the first and second printed circuit boards by a respective press-in connection. In this case, the connecting element can advantageously be designed in such a way that the first part of the second printed circuit board is mounted in the housing without any further fastening.

In accordance with a further expedient configuration, only one of the first or second printed circuit boards is connected thermally to the housing. Heat dissipation from the other of the two printed circuit boards takes place via the connecting element. This makes it possible to facilitate fitting of the control apparatus.

A further advantageous configuration provides that components with comparatively high power losses are arranged on the printed circuit board which is thermally connected to the housing, and components with comparatively low power losses are arranged on the printed circuit board which is not arranged thermally on the housing. The possibility of being able to arrange components with different power losses on one of the two printed circuit boards makes it possible in a particularly simple manner to provide a thermally optimized device.

It is furthermore expedient if the first part of the first and/or the second printed circuit board(s) is populated in each case at least partially on both sides with electrical and/or electronic components. As a result, a particularly large number of components can be accommodated in the control apparatus, as a result of which a large number of functionalities can be provided in an unchanged installation space.

BRIEF DESCRIPTION OF THE SEVERAL VIEWS OF THE DRAWING

The invention will be explained in more detail below with reference to an exemplary embodiment in the drawing, in which.

DESCRIPTION OF THE INVENTION

Figure 1:
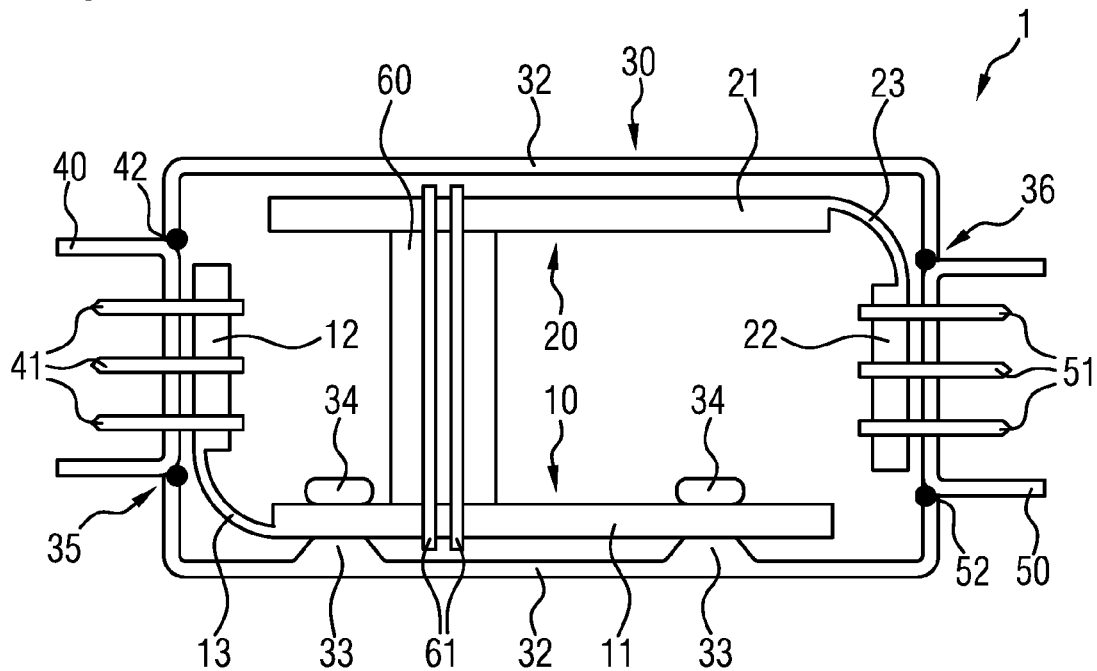
FIG. 1 shows a schematic cross-sectional illustration of a control device according to the invention.

FIG. 1 shows a control apparatus 1, for example a motor or transmission control device for a motor vehicle. Combined control apparatuses for motor and transmission or other control and regulation functions of a motor vehicle are also conceivable. The control apparatus 1 has a housing 30, which consists of a housing lower part 31 and a housing upper part 32. The housing 30 formed from the housing lower part 31 and the housing upper part 32 has an end-side opening 35, into which a first plug-type connector 40 can be inserted. In addition, the housing 30 has a second end-side opening 36, into which a second plug-type connector 50 can be inserted. The plug-type connectors 40, 50 inserted close off the housing 30.

A seal (not illustrated) is inserted in a groove (likewise not illustrated) between the housing lower part 31 and the housing upper part 32. This seal may be a seal which is prefabricated from a plastics material or a curing or non-curing fluid seal. Likewise, a respective seal 42, 52 is inserted between the housing 30 and the plug-type connectors 40, 50.

A first printed circuit board 10, which is arranged in the fitted state in the interior of the housing 30, is electrically and mechanically connected to the plug-type connector 40. In a corresponding manner, a second printed circuit board 20, which is arranged in the fitted state likewise in the interior of the housing 30, is electrically and mechanically connected to the plug-type connector 50.

The design of the first and second printed circuit boards is in principle identical. The multilayered printed circuit boards 10, 20 each have a first rigid part 11, 21, which is optionally populated at least partially on both sides with components (not illustrated). A second, likewise rigid part 12, 22 of the printed circuit boards 10, 20 is electrically and mechanically connected to the associated plug-type connectors 40, 50. A third part 13, 23 of the printed circuit boards 10, 20 is arranged between the first part 11, 21 and the second part 12, 22 of the printed circuit boards 10, 20 and connects the first and second parts electrically and mechanically.

The respective third part 13, 23 is bendable. This means that the second part 12, 22 with the plug-type connector 40, 50 can be bent at least once in order to install the printed circuit boards 10, 20 in the housing 30 in this third part 13, 23, with the result that the plug-type connector 40, 50 can be inserted into the end-side opening 35, 36.

Contact pins 41 of the first plug-type connector 40 and contact pins 51 of the second plug-type connector 50 and associated cutouts in the respective second parts 12, 22 of the first and second printed circuit boards 10, 20 are preferably formed in such a way that the contact pins 41, 51 can be fitted easily into the cutouts in the associated printed circuit boards 10, 20. This results in an electrical and mechanical connection between the contact pins 41, 51 and the printed circuit board 10, 20.

The printed circuit boards 10, 20 are preferably in the form of printed circuit boards with four layers. With respect to the specific configuration and possible modifications, reference is made to EP 1 575 344 A1, the contents of which are incorporated by reference in the present application.

As can readily be seen from the cross-sectional illustration in FIG. 1, the first parts 11, 21 of the first and second printed circuit boards 10, 20 are arranged in the interior of the housing 30 on opposite sides of the housing. An electrical and mechanical connection of the first parts 11, 21 to one another takes place via a connecting element 60. In this case, contact pins 61 of the connecting element 60 are electrically connected to one another by way of conductor tracks (not illustrated) of the first parts 11, 21 of the first and second printed circuit boards 10, 20 by a respective press-in connection.

Although, in the exemplary embodiment shown in FIG. 1, only a single connecting element 60 is illustrated, the electrical and/or mechanical connection between the first parts 11, 21 of the printed circuit boards 10, 20 could also take place via a plurality of such connecting elements 60.

Preferably, the connecting element 60 is configured in such a way that the first part 21 of the second printed circuit board 20 does not require any further fastening on the housing 30. In contrast, the first part 11 of the first printed circuit board 10 is held mechanically on the housing lower part 32 of the housing. For this purpose, the first part 11 rests on a plurality of projections of the housing lower part 32 which form rests 33. Mechanical fastening of the first part 11 of the first printed circuit board 10 on the housing lower part 32 takes place via fastening means 34, for example screws or rivets.

In the exemplary embodiment, the plug-type connectors 40, 50 come to lie on opposite surface sides of the housing 30. The joining direction of a plug-type connection therefore runs parallel to the first parts 11, 21 of the printed circuit boards 10, 20. Furthermore, the joining direction of the two plug-type connections runs in the direction of a common axis.

Owing to a mechanical connection of the first part 11 of the first printed circuit board 10, it is expedient to arrange components with high power losses on this first part 11 of the first printed circuit board 10. Since heat can only be dissipated from the first part 21 of the second printed circuit board 20 via the connecting element 60, the first printed circuit board 10 and the housing lower part 32, it is furthermore expedient to provide components with lower power losses on the second printed circuit board 20.

Since data interchange between components on the first printed circuit board and components on the second printed circuit board 20 can take place via the contact pins 61 of the connecting element 60, it is expedient to position components which are used for data interchange close to the connecting element 60 on the first parts 11, 21 of the first and second printed circuit boards 10, 20.

The provision of two plug-type connectors protruding out of the housing furthermore has the advantage that such a control apparatus takes up a reduced amount of spatial volume in comparison with a control apparatus with identical functionalities and only a single plug-type connector with a correspondingly increased number of contact pins. In the case of such a conventional control apparatus, with only one single plug-type connector, either the plug-type connector would need to be widened or increased in height in order to realize the corresponding number of contact pins. Both cases result in enlarged side edges of the housing and therefore an enlarged spatial volume.

In comparison with a control apparatus which has a single printed circuit board with two flexible parts for forming two plug-type connections protruding out of the housing on different surface sides, the proposed procedure has the advantage of simpler producibility with less susceptibility to faults.

By virtue of the provision of a further, second printed circuit board which is borne "piggybacked" by the first printed circuit board, a substantially greater number of components can be realized in the control apparatus. Furthermore, the components can be distributed over one or the other printed circuit board corresponding to their power losses.

A particularly simple implementation of such a control apparatus results when the surfaces of the first parts 11, 21 of the first and second printed circuit boards 10, 20 are arranged parallel to one another. As a result, the connecting element 60 (or the connecting elements) can be formed with straight contact pins. Furthermore, the plug-type connectors 40, 50 can be implemented on different surface sides of the housing, depending on the orientation of the printed circuit boards 10, 20 with respect to one another. This is illustrated by way of example in FIGS. 2 to 4.

Figure 2:
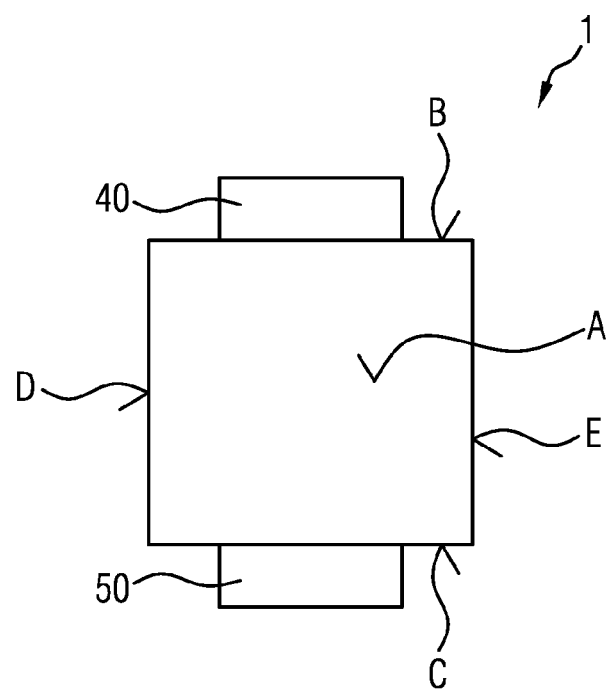
FIGS. 2 to 4 show schematic illustrations of control apparatuses according to the invention with differently arranged plug-type connectors.

FIG. 2 shows a plan view of a control apparatus 1 according to the invention. The surface side visible in the plane of the paper is denoted by A. The first plug-type connector 40 is formed on a surface side B, the second plug-type connector 50 is formed on an opposite surface side C. The arrangement therefore corresponds to that shown in FIG. 1.

Figure 3:
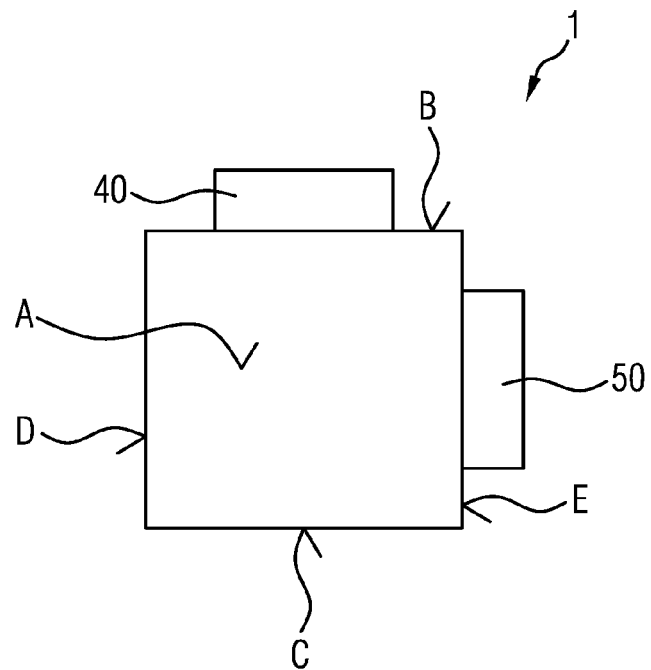

In FIG. 3, the first and second printed circuit boards are turned through 90° with respect to the variant shown in FIG. 1, with the result that the first plug-type connector 40 furthermore comes to lie on surface side B and the second plug-type connector 50 comes to lie, turned through 90°, on surface side E.

Figure 4:
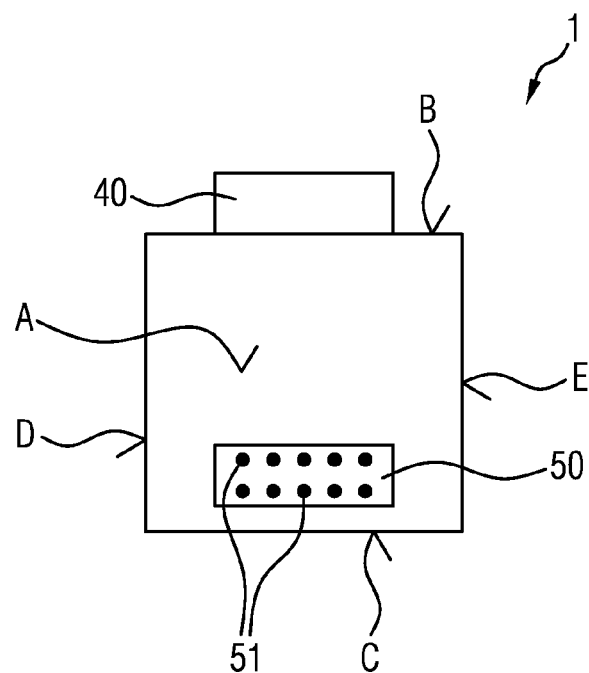

FIG. 4 shows a further configuration variant in which the third part 23 of the second printed circuit board 20 is not bent. This means that the first part 21 and the second part 22 lie in one plane. As a result, the first plug-type connector again comes to lie on surface side B and the second plug-type connector 50 on surface side A.

In a further variant configuration (not illustrated), a control apparatus could also be implemented with more than two printed circuit boards. The first parts of the printed circuit boards would then be arranged parallel to one another in the housing and would be mechanically and electrically connected to one another via a corresponding number of connecting elements.

The description using the exemplary embodiments does not restrict the invention to these exemplary embodiments. Rather, the invention includes any novel feature and any combination of features, which in particular includes any combination of features in the exemplary embodiments and patent claims.

The invention claimed is:

1. A control apparatus, comprising:
a housing;
a first one-piece integral multilayered printed circuit board having a first part populated with electrical and/or electronic components, a second part electrically and mechanically connected to at least one contact pin of a first plug-type connector, and a third part connecting said first and second parts to one another and said first printed circuit board being flexible or at least bendable in said third part;
a second one-piece integral multilayered printed circuit board having a first part populated with electrical and/or electronic components, a second part electrically and mechanically connected to a contact pin of a second plug-type connector, and a third part connecting said first and second parts of said second printed circuit board to one another and said second printed circuit board being flexible or at least bendable in said third part thereof; and
at least one connecting element electrically connecting said first parts of said first and second printed circuit boards to one another via a plug-type connection; and
said first parts of said first printed circuit board and said second printed circuit board being mechanically connected to one another by way of said at least one connecting element, said first part of said first printed circuit board being held mechanically on said housing, and said first part of said second printed circuit board not being fastened to said housing, only one of said first or second printed circuit boards being in thermally conductive contact with said housing; and components with comparatively high power losses being disposed on the respective said printed circuit board that is thermally connected to said housing, and components with comparatively low power losses being disposed on the respective said printed circuit board that is not thermally connected to said housing.

2. The control apparatus according to claim 1 configured for a motor vehicle.

3. The control apparatus according to claim 1, wherein said first parts of said first and second printed circuit boards are arranged parallel to one another in said housing, and said first and second plug-type connectors are arranged on mutually different main surfaces of said housing.

4. The control apparatus according to claim 1, wherein said first and second printed circuit boards are arranged on mutually opposite sides of said housing.

5. The control apparatus according to claim 1, wherein said connecting element comprises contact pins electrically connected to conductor tracks of said first parts of said first and second printed circuit boards by a respective press-in connection.

6. The control apparatus according to claim 1, wherein heat dissipation from said printed circuit board not thermally connected to said housing is effected via said connecting element.

7. The control apparatus according to claim 1, wherein said first part of said first printed circuit board and/or said first part of said second printed circuit board is at least partially populated on both sides with electrical and/or electronic components.

* * * * *